United States Patent
Kanakasabai et al.

(10) Patent No.: US 12,142,934 B2
(45) Date of Patent: Nov. 12, 2024

(54) OVERLAPPING SECONDARY COILS IN A WIRELESS POWER RECEPTION APPARATUS

(71) Applicant: GE Intellectual Property Licensing, LLC, Niskayuna, NY (US)

(72) Inventors: Viswanathan Kanakasabai, Bangalore (IN); Suma Memana Narayana Bhat, Bangalore (IN); Jayanti Ganesh, Bangalore (IN); Subbarao Tatikonda, Bangalore (IN)

(73) Assignee: GE Intellectual Property Licensing, LLC, Niskayuna, NY (US)

( * ) Notice: Subject to any disclaimer, the term of this patent is extended or adjusted under 35 U.S.C. 154(b) by 785 days.

(21) Appl. No.: 17/166,857

(22) Filed: Feb. 3, 2021

(65) Prior Publication Data
US 2021/0265864 A1    Aug. 26, 2021

(30) Foreign Application Priority Data
Feb. 26, 2020  (IN) .............................. 202011008168

(51) Int. Cl.
*H02J 7/00* (2006.01)
*H01F 1/34* (2006.01)
(Continued)

(52) U.S. Cl.
CPC .............. *H02J 50/10* (2016.02); *H01F 1/344* (2013.01); *H01F 27/2804* (2013.01);
(Continued)

(58) Field of Classification Search
USPC .......................... 320/106, 107, 108, 109, 110
See application file for complete search history.

(56) References Cited

U.S. PATENT DOCUMENTS

| 9,409,490 B2 | 8/2016 | Kawashima |
| 9,413,191 B2 | 8/2016 | Kim et al. |

(Continued)

FOREIGN PATENT DOCUMENTS

| CN | 206314129 | 7/2017 |
| CN | 105098998 | 2/2020 |

(Continued)

OTHER PUBLICATIONS

"India Application No. 202011008168 First Examination Report", Sep. 21, 2021, 6 pages.

*Primary Examiner* — Brian Ngo
(74) *Attorney, Agent, or Firm* — DeLizio, Peacock, Lewin & Guerra, LLP

(57) ABSTRACT

One innovative aspect of the subject matter described in this disclosure can be implemented in a wireless power reception apparatus. In some implementations, the wireless power reception apparatus may include a ferrite layer including a void. The wireless power reception apparatus may also include a first secondary coil configured to generate first power in cooperation with one or more primary coils of a wireless power transmission apparatus, where at least a portion of the first secondary coil resides in the void of the ferrite layer. The wireless power reception apparatus may also include one or more second secondary coils configured to generate second power in cooperation with the one or more primary coils of the wireless power transmission apparatus, where a portion of the second secondary coil is overlaying the portion of the first secondary coil residing in the void of the ferrite layer.

11 Claims, 8 Drawing Sheets

(51) Int. Cl.
   *H01F 27/28* (2006.01)
   *H01F 41/04* (2006.01)
   *H02J 7/02* (2016.01)
   *H02J 50/10* (2016.01)
   *H02J 50/40* (2016.01)
   *H05K 1/16* (2006.01)

(52) U.S. Cl.
   CPC .............. *H01F 41/041* (2013.01); *H02J 7/02* (2013.01); *H02J 50/402* (2020.01); *H05K 1/165* (2013.01); *H01F 2027/2809* (2013.01)

(56) References Cited

U.S. PATENT DOCUMENTS

| | | |
|---|---|---|
| 9,796,280 B2 | 10/2017 | McCool et al. |
| 9,855,437 B2 | 1/2018 | Nguyen et al. |
| 10,122,192 B2 | 11/2018 | Chopra et al. |
| 2014/0176288 A1 | 6/2014 | Jung et al. |
| 2015/0051750 A1 | 2/2015 | Kurs et al. |
| 2015/0371771 A1 | 12/2015 | Abu Qahouq |
| 2016/0094043 A1 | 3/2016 | Hao et al. |
| 2016/0336817 A1 | 11/2016 | Jabori et al. |

FOREIGN PATENT DOCUMENTS

| | | | |
|---|---|---|---|
| EP | 2433347 | | 10/2013 |
| JP | 2002093625 A | * | 9/2000 |
| JP | 2016537958 A | * | 9/2014 |
| KR | 20160009632 | | 1/2016 |
| WO | 2014082571 | | 6/2014 |

* cited by examiner

OVERLAPPING SECONDARY COILS IN A WIRELESS POWER RECEPTION APPARATUS

TECHNICAL FIELD

This application claims the priority benefit of India Application No. 202011008168 filed Feb. 26, 2020.

TECHNICAL FIELD

This disclosure relates generally to wireless power, and more specifically to a wireless power reception apparatus.

DESCRIPTION OF THE RELATED TECHNOLOGY

Conventional wireless power systems have been developed with a primary objective of charging a battery in a wireless power reception apparatus, such as a mobile device, a small electronic device, gadget, or the like. In a conventional wireless power system, a wireless power transmission apparatus may include a primary coil that produces an electromagnetic field. The electromagnetic field may induce a voltage in a secondary coil of a wireless power reception apparatus when the secondary coil is placed in proximity to the primary coil. In this configuration, the electromagnetic field may transfer power to the secondary coil wirelessly. The power may be transferred using resonant or non-resonant inductive coupling between the primary coil and the secondary coil. The wireless power reception apparatus may use the received power to operate or may store the received energy in a battery for subsequent use.

SUMMARY

The systems, methods, and apparatuses of this disclosure each have several innovative aspects, no single one of which is solely responsible for the desirable attributes disclosed herein.

One innovative aspect of the subject matter described in this disclosure can be implemented in a wireless power reception apparatus. In some implementations, the wireless power reception apparatus may include a ferrite layer having a void. The wireless power reception apparatus may also include a first secondary coil configured to generate first power in cooperation with one or more primary coils of a wireless power transmission apparatus, wherein at least a portion of the first secondary coil resides in the void of the ferrite layer. The wireless power reception apparatus may also include one or more second secondary coils configured to generate second power in cooperation with the one or more primary coils of the wireless power transmission apparatus, where a portion of the second secondary coil is overlaying the portion of the first secondary coil residing in the void of the ferrite layer.

Implementations may include one or more of the following features. In the wireless power reception apparatus, the void of the ferrite layer may extend through an entire thickness of the ferrite layer. In the wireless power reception apparatus, the void of the ferrite layer may be a recess occupying a portion of a thickness of the ferrite layer. In the wireless power reception apparatus, the void may be formed by stacking pieces of ferrite material. In the wireless power reception apparatus, each of the first secondary coil and the one or more secondary coils may include a square-shaped or a rectangular-shaped path of copper wire. In the wireless power reception apparatus, the wireless power reception apparatus may be coupled with an electronic device where the first power and the second power charge a battery of the electronic device. In the wireless power reception apparatus, the first secondary coil may be a main secondary coil and the second secondary coils may be auxiliary secondary coils. In the wireless power reception apparatus, the first secondary coil may be an auxiliary secondary coil and the second secondary coils may be main secondary coils.

Another innovative aspect of the subject matter described in this disclosure can be implemented in a wireless power reception apparatus. In some implementations, the wireless power reception apparatus includes a printed circuit board component. The printed circuit board (PCB) component may include a PCB. The PCB may include a plurality of layers that include at least a top side of the PCB and a bottom side of the PCB. The PCB may also include a main secondary coil including conductive material configured to receive wireless power in the form of electromagnetic energy from one or more primary coils of a wireless power transmission apparatus, wherein first segments of the main secondary coil reside in a first plurality of the layers. The PCB can also include an auxiliary secondary coil including conductive material configured to receive wireless power in the form of electromagnetic energy from the one or more primary coils of the wireless power transmission apparatus. The first segments of the auxiliary secondary coil may reside in a second plurality of the layers.

Implementations may include one or more of the following features. In the PCB component, the first plurality of the layers may not include the second plurality of the layers. In the PCB component, the first plurality of the layers may include one or more layers of the second plurality of the layers. In the PCB component, a first layer of the plurality of layers may include the top side of the PCB and a second layer of the plurality of layers includes the bottom side of the PCB. In the PCB component, at least one via connected to the first segments of the main secondary coil. In the PCB component, second segments of the main secondary coil may reside in one or more layers of the first plurality of the layers, and second segments of the auxiliary secondary coil may reside in one or more layers of the second plurality of the layers. In the PCB component, the first and second segments of the main secondary coil do not intersect with the first and second segments of the auxiliary secondary coil. The PCB component can further include main vias configured to connect the first segments of the main secondary coil to the second segments of the main secondary coil. The PCB component can also include auxiliary vias configured to connect the first segments of the auxiliary secondary coil to the second segments of the auxiliary secondary coil.

Another innovative aspect of the subject matter described in this disclosure can be implemented in a wireless power reception apparatus. In some implementations, a method for creating a wireless power receiver apparatus comprising creating a void in a ferrite material. The method may also include depositing a first secondary coil on the ferrite material, wherein the first secondary coil is configured to generate first power in cooperation with one or more primary coils of a wireless power transmission apparatus, wherein at least a portion of the first secondary coil resides in the void of the ferrite material. The method may also include depositing a second secondary coil configured on the ferrite material, wherein the second secondary coil is configured to generate second power in cooperation with the one or more primary coils of the wireless power transmission apparatus, wherein a portion of the second secondary coil overlays the portion of the first secondary coil residing in the void of the ferrite material.

Implementations may include one or more of the following features. In the method, creating the void in the ferrite material may comprise placing pieces of the ferrite material in a configuration that forms the void. In the method, the pieces of the ferrite material may be of uniform thickness. In the method, two or more of the pieces of the ferrite material may be differently shaped. In the method, the ferrite material may be unitary and wherein creating the void in the ferrite material comprises removing a portion of the unitary ferrite material.

Details of one or more implementations of the subject matter described in this disclosure are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
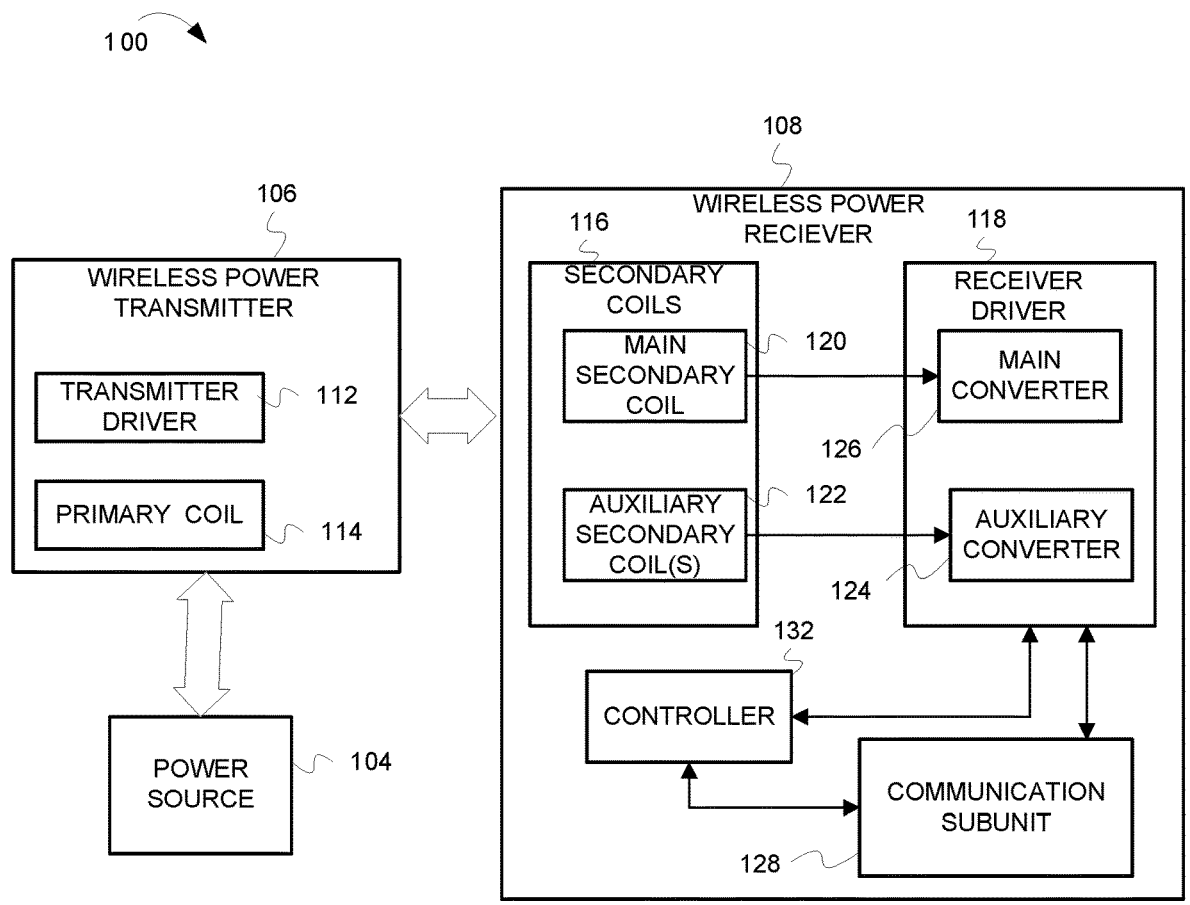
FIG. 1 shows an overview of components associated with an example wireless power system according to some implementations.

The following description is directed to certain implementations for the purposes of describing innovative aspects of this disclosure. However, a person having ordinary skill in the art will readily recognize that the teachings herein can be applied in a multitude of different ways. The described implementations can be implemented in any means, apparatus, system, or method for transmitting or receiving wireless power.

A traditional wireless power system may include a wireless power transmission apparatus and a wireless power reception apparatus. The wireless power transmission apparatus may include a primary coil that transmits wireless energy (as a wireless power signal) to a corresponding secondary coil in the wireless power reception apparatus. A primary coil refers to a source of wireless energy (such as inductive or magnetic resonant energy) in a wireless power transmission apparatus. A secondary coil is located in a wireless power reception apparatus and receives the wireless energy. Wireless power transmission is more efficient when the primary and secondary coils are closely positioned. Conversely, the efficiency may decrease (or the charging may cease) when the primary and secondary coils are misaligned. When properly aligned, primary coils and secondary coils can transfer wireless energy up to an amount predetermined by a wireless standard. For example, a wireless power signal may convey 5 Watts (W), 9 W, 12 W, 15 W, or more. The charging capability may be related to how closely the primary coil and secondary coil are positioned or aligned with each other. In this disclosure, alignment may refer to a spatial relationship between a secondary coil of the wireless power reception apparatus and a primary coil of the wireless power transmission apparatus. A misalignment may reduce the efficiency of the wireless charging or may cause an increase in wireless power signal from a primary coil to adjust for the misalignment. For example, a primary coil may output a higher amount of magnetic flux in order to meet the demand of a load associated with a secondary coil that is not well aligned. Undesirable electromagnetic interference (EMI) may be caused by excess magnetic flux that is not linked to the secondary coil.

This disclosure provides systems, methods, and apparatus for wireless power reception. Various implementations relate generally to a wireless power reception apparatus that have multiple secondary coils. In accordance with aspects of this disclosure, a wireless power system may utilize one or more primary coils and a plurality of secondary coils to transfer wireless power from a wireless power transmission apparatus to a wireless power reception apparatus. For example, a primary coil may transmit a power signal to a corresponding secondary coil.

In some implementations, a wireless power reception apparatus includes a ferrite material, a main secondary coil, and one or more auxiliary secondary coils. The main and auxiliary secondary coils may be arranged where portions of the coils are stacked on each other. To ensure the stacked coils do not increase an overall thickness of the wireless power receiver apparatus, the ferrite material may have voids (which also may be referred to as recesses or cutouts) that make room for overlapping secondary coils. By placing overlapping portions of the secondary coils in the voids, the overlapping coils do not increase an overall thickness of the wireless power receiver apparatus.

In some implementations, a wireless power receiver apparatus includes a printed circuit board (PCB) component including a top layer and bottom layer. On the top layer, the PCB includes a top-layer main secondary coil including a continuous concentric path of conductive material. The top layer also includes a top-layer auxiliary secondary coil including noncontinuous paths of conductive material interspersed with the top-layer main secondary coil. On the bottom layer, the PCB includes a bottom-layer main secondary coil including a noncontinuous concentric path of conductive material. The bottom layer also includes a bottom-layer auxiliary secondary coil including a continuous path of conductive material interspersed with the bottom-layer main secondary coil. The conductive material on a top layer and the conductive material on the bottom layer may be electrically connected by a vertical interconnect access (VIA, also referred to as a via for brevity). For example, a via may include two pads, in corresponding positions on the top layer and the bottom layer, that are electrically connected by a conductive hole through the PCB. The hole through the PCB may be made to be conductive using electroplating, conductive tube lining, or a rivet, among other examples. In some implementations, vias are placed at many portions of the main coil to connect the portions of the bottom-layer non-continuous concentric paths of the main coil to the continuous concentric paths of the main coil on the top layer. Similarly, several vias connect the portions of the non-continuous top-layer auxiliary coils to the continuous tracks of the corresponding coil laid on the bottom layer.

Particular implementations of the subject matter described in this disclosure can be implemented to realize one or more of the following potential advantages. In some implementations, a wireless power receiver apparatus includes overlapping secondary coils placed on a ferrite material. In places where secondary coils overlap, the wireless power receiver apparatus may be thicker than where secondary coils do not overlap. Some implementations include voids in the ferrite material to offset an added thickness arising from overlapping secondary coils. By placing overlapping coil portions in the voids, an overall thickness of the wireless power receiver apparatus is not increased.

FIG. 1 shows an overview of components associated with an example wireless power system according to some implementations. The wireless charging system 100 is connected to a power source 104. In FIG. 1, the wireless charging system 100 includes a wireless power transmitter 106 and a wireless power receiver 108. In some implementations, the wireless power transmitter 106 may be magnetically coupled to the wireless power receiver 108.

The wireless power transmitter 106 includes a transmitter driver 112 coupled to a primary coil 114. In some implementations, the transmitter driver 112 may include a converter. The transmitter driver 112 includes a plurality of switches. The plurality of switches includes semiconductor switches, such as an insulated gate bipolar transistor, a metal oxide semiconductor field-effect transistor, a field-effect transistor, an injection enhanced gate transistor, an integrated gate commutated thyristor, a gallium nitride based switch, a silicon carbide based switch, a gallium arsenide based switch, diodes, or the like. In some implementations, the primary coil 114 may be a wound copper wire.

Further, the wireless power receiver 108 includes secondary coils 116 and a receiver driver 118. In some implementations, the secondary coils 116 includes a main secondary coil 120 and one or more auxiliary secondary coils 122.

The wireless power receiver 108 may form a part of a two-coil wireless charging system, a three-coil wireless charging system, and a four-coil wireless charging system. As will be appreciated, the two-coil wireless charging system includes only the receiver and the transmitter. A three-coil charging system may include a field focusing coil in addition to the receiver and the transmitter. A four-coil charging system may include a phase compensation coil in addition to the receiver, the field focusing coil, and the transmitter.

In some implementations, the main secondary coil 120 and the plurality of auxiliary secondary coils 122 are resonant coils. In particular, each of the main secondary coil 120 and the plurality of auxiliary secondary coils 122 may be coupled to a corresponding capacitor. In one specific embodiment, the main secondary coil 120 and the plurality of auxiliary secondary coils 122 are compatible with a Wireless Power Consortium (WPC) standard (Qi) that is defined in a frequency range of 100 kHz to 200 kHz.

In FIG. 1, the receiver driver 118 includes a main converter 126 and auxiliary converter 124. The main secondary coil 120 is coupled to the main converter 126. The main converter 126 includes a main output terminal and is configured to rectify a voltage induced at the main secondary coil 120 during operation.

The auxiliary secondary coils 122 are coupled to the auxiliary converter 124. The auxiliary converter 124 is configured to rectify a voltage induced at the auxiliary secondary coils 122 during operation. In some implementations, each auxiliary secondary coil 122 is coupled to a corresponding auxiliary converter 124. In some implementations, at least one of the auxiliary converters is a passive rectifier. In one specific implementation, the passive rectifier is a diode rectifier.

In some implementations, the auxiliary converter 124 are coupled to each other to form an auxiliary output terminal. In accordance with aspects of the present specification, the main output terminal of the main converter 126 is coupled to the auxiliary output terminal in series. Further, a load is coupled across the main output terminal and the auxiliary output terminal.

In some implementations, conventional wireless charging systems may include a single secondary coil. This secondary coil contributes towards the supply of a voltage to a load, such as a battery. In one scenario, if the secondary coil is not aligned with a primary coil, in order to induce a desired voltage in the secondary coil, the current in the primary coil has to be higher than that current in the primary coil when the secondary coil is aligned with the primary coil. As a result, the efficiency of the conventional wireless charging system is compromised. Shortcomings of the conventional wireless charging systems can be circumvented using implementations of the wireless charging system 100.

As noted hereinabove, the wireless power receiver 108 includes the auxiliary secondary coils 122 in addition to the main secondary coil 120. The combination of the main secondary coil 120 and the auxiliary secondary coils 122 is configured to provide desired voltage to the load, via the corresponding main and auxiliary converters 124, 126, even in an event of misalignment of the main secondary coil 120 with respect to the primary coil 114.

In particular, during operation of the wireless charging system 100, power provided from the power source 104 is converted to alternating current (AC) form by the transmitter driver 112 and provided to the primary coil 114. Accordingly, the primary coil 114 is energized, and a magnetic field is generated at the primary coil 114. The magnetic field at the primary coil 114 induces a voltage at the main secondary coil 120 and one or more auxiliary secondary coils 122 based on an alignment of the main secondary coil 120 and the auxiliary secondary coils 122 with respect to the primary coil 114.

The voltage induced at the main secondary coil 120 and the auxiliary secondary coils 122 is transmitted to the main converter 126 and the auxiliary converter 124, respectively. A rectified voltage is generated at the main output terminal of the main converter 126, and a rectified voltage is generated at the auxiliary output terminal of the auxiliary converter 124. The communication subunit 128 and controller 132 can cooperate to exchange power information between components of the wireless charging system 100.

In some implementations, if a central axis of the primary coil 114 is aligned with a central axis of the main secondary coil 120, the main secondary coil 120 is aligned with the primary coil 114. When the main secondary coil 120 is aligned with the primary coil 114, the main secondary coil 120 has satisfactory magnetic coupling with the primary coil 114. In the event of satisfactory magnetic coupling between the primary coil 114 and the main secondary coil 120, a higher voltage is induced across the main secondary coil 120 compared to a voltage induced at the main secondary coil 120 during a misaligned condition of the main secondary coil 120 with respect to the primary coil 114.

In some implementations, the main converter 126 and the auxiliary converter 124 are connected in series. Sometimes during power transfer, the primary coil 114 is aligned with the main secondary coil 120. During alignment, any voltage induced by the main secondary coil 120 will be relatively high whereas voltages in the one or more auxiliary secondary coils 122 will be relatively low. Hence, during alignment, there will be relatively high rectified voltages in the main converter 126 and relatively low rectified voltages in the auxiliary converter 124. During alignment, the resulting power contribution from the main secondary coil 120 will be higher than power contribution from the one or more auxiliary secondary coils 122. As the primary coil 114 moves out of alignment with the main secondary coil 120, voltage induced in the mail secondary coil 120 drops. For any auxiliary secondary coil 122 that moves into more favorable alignment with the primary coil 114, induced voltage increases. When an auxiliary secondary coil is more favorably aligned with the primary coil 114, rectified voltages in the auxiliary converter 124 increase whereas rectified voltages in the main converter 126 decrease. Despite misalignment between the primary coil 114 and main secondary coil 120, load voltage and power are maintained by power contributions of the auxiliary secondary coils(s).

Figure 2A:
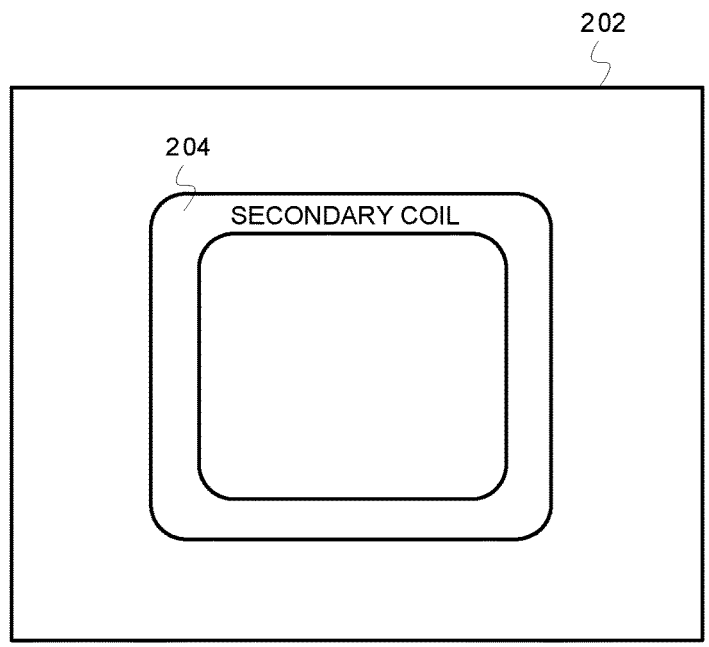
FIG. 2A is a block diagram illustrating components of a wireless power receiver apparatus according to some implementations.
Figure 2B:
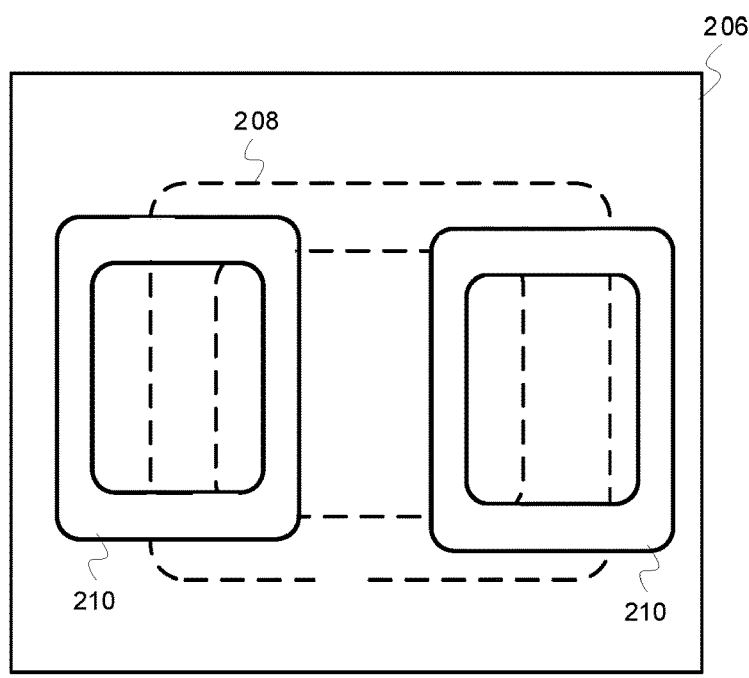
FIG. 2B is a block diagram illustrating components of a wireless power receiver apparatus including a main secondary coil and a plurality of auxiliary secondary coils according to some implementations.

FIG. 2A is a block diagram illustrating components of a wireless power receiver apparatus according to some implementations. In FIG. 2B, a wireless power receiver apparatus includes a ferrite material 202 and a secondary coil 204. The ferrite material 202 may reside between the secondary coil 204 and the electronic components of the electronic device. Hence, the ferrite material 202 may shield those electronic components from magnetic fields and help focus the electromagnetic energy onto the secondary coil 204.

FIG. 2B is a block diagram illustrating components of a wireless power receiver apparatus including a main secondary coil and a plurality of auxiliary secondary coils according to some implementations. Although the wireless power receiver apparatus shown in FIG. 2A includes a single secondary coil, some implementations include multiple secondary coils. In some instances, a wireless power receiver apparatus includes a main secondary coil and one or more auxiliary secondary coils. The main and auxiliary secondary coils can be placed in any suitable arrangement. For example, portions of the auxiliary secondary coils may overlay portions of a main secondary coil. In FIG. 2B, the wireless power receiver apparatus includes a ferrite material 206 and a main secondary coil 208 (broken line). Auxiliary secondary coils 210 are superimposed (which also may be referred to as "overlayed" or "overlapped") over portions of the main secondary coil 208. Portions of the main secondary coil 208 and the auxiliary secondary coils 210 overlap. When portions of auxiliary secondary coils overlap with a main secondary coil, an overall thickness of a wireless power receiver apparatus may increase. Increasing the thickness of the wireless power receiver apparatus may result in the apparatus that is too large for certain environments. Some implementations avoid increasing thickness by recessing portions of the secondary coils into voids of a ferrite material. The following discussion will provide additional details about these and other implementations.

Figure 3:
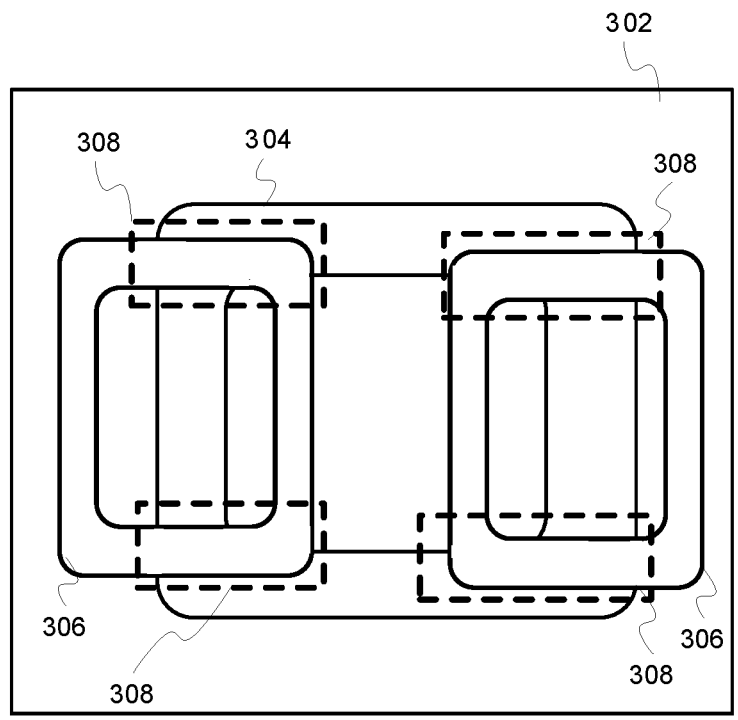
FIG. 3 is a block diagram illustrating a main secondary coil overlapping portions of auxiliary secondary coils in a wireless power receiver apparatus according to some implementations.

FIG. 3 is a block diagram illustrating a main secondary coil overlapping portions of auxiliary secondary coils in a wireless power receiver apparatus according to some implementations. As shown, a wireless power receiver apparatus may include a ferrite material 302, main secondary coil 304, and auxiliary secondary coils 306. The auxiliary secondary coils 306 may be superimposed over the main secondary coil 304. In some implementations, the secondary coils (304 and 306) and ferrite material 302 form three layers. The ferrite material 302 may form a base layer on top of which resides the main secondary coil 304. The auxiliary secondary coils 306 may be stacked atop the main secondary coil 304. Overlapping regions 308 identify portions of the auxiliary secondary coils 306 that overlap portions of the main secondary coil 304.

In some implementations, at least a portion of the main secondary coil 304 is recessed into the ferrite material 302. For example, portions of the main secondary coil 304 that overlap auxiliary secondary coils 306 may be recessed into the ferrite material. Recessing one or more portions of the main secondary coil 304 into the ferrite material 302 can reduce the thickness of the wireless power receiver apparatus. The discussion of FIGS. 4A-4B describes how some implementations may recess secondary coils into a ferrite material.

Figure 4A:
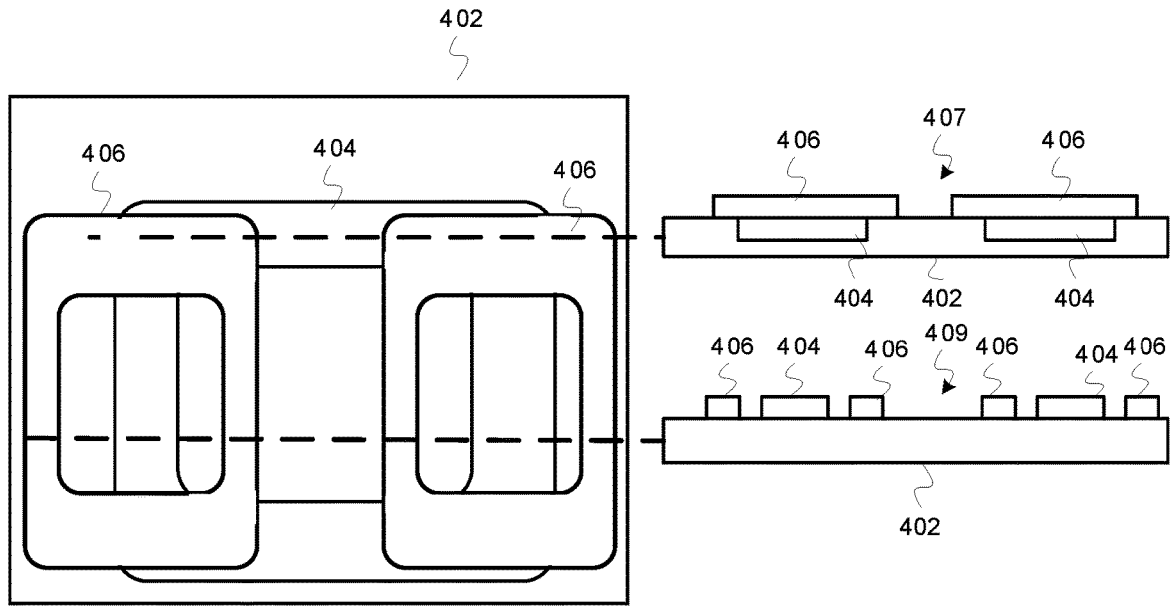
FIG. 4A is a block diagram illustrating a wireless power receiver apparatus in which secondary coils are recessed into a ferrite material according to some implementations.

FIG. 4A is a block diagram illustrating a wireless power receiver apparatus in which secondary coils are recessed into a ferrite material according to some implementations. As shown in FIG. 4A, a wireless power receiver apparatus may include a ferrite material 402, main secondary coil 404, and auxiliary secondary coils 406. The auxiliary secondary coils 406 may be superimposed over the main secondary coil 404. FIG. 4A includes a cross-sectional view 407 in which the main secondary coil 404 is fully recessed into the ferrite material 402. As shown, the auxiliary secondary coils 406 may be stacked on the main secondary coil 404 and ferrite material 402. As shown, a layer of the ferrite material 402 may underlie the main secondary coil 404. However, in some implementations, the ferrite material 402 is completely cut away so no ferrite material underlies at least one portion of at least one secondary coil. Such an example will be described below (see FIG. 4B). FIG. 4A also presents a cross-sectional view 409 showing portions of the main secondary coil 404 and the auxiliary secondary coils 406. The cross-sectional view 409 illustrates non-overlapping portions of the main and auxiliary secondary coils (404 and 406) that are not recessed into the ferrite material 402.

Figure 4B:
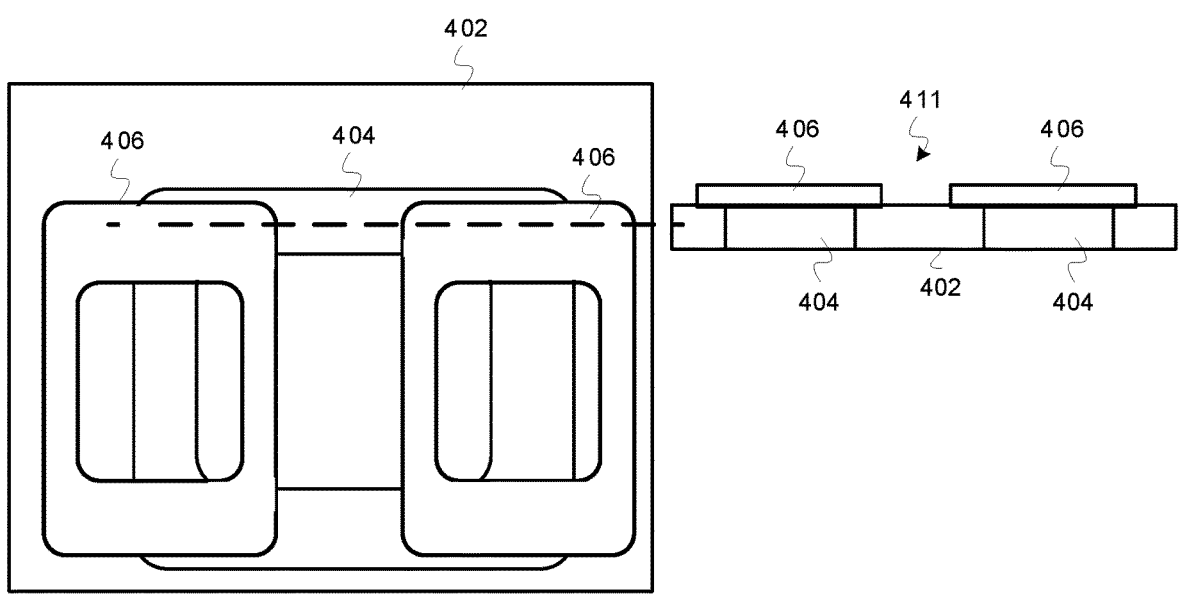
FIG. 4B is a block diagram illustrating a wireless power receiver apparatus in which ferrite material is cut away to accommodate secondary coils according to some implementations.

FIG. 4B is a block diagram illustrating a wireless power receiver apparatus in which ferrite material is cut away to accommodate secondary coils according to some implementations. As shown in FIG. 4B, a wireless power receiver apparatus may include a ferrite material 402, main secondary coil 404, and auxiliary secondary coils 406. As shown in FIG. 4B, the auxiliary secondary coils 406 may be superimposed over the main secondary coil 404. FIG. 4B includes a cross-sectional view 411 in which the ferrite material 402 is completely removed to accommodate portions of the main secondary coil 404. In the cross-sectional view 411, the ferrite material 402 does not underlie the portions of the main secondary coil 404.

FIGS. 4A-4B show how the ferrite material may include voids in which portions of the secondary coils reside. The voids may be recesses in the thickness of the ferrite material (see view 407) or sections where the ferrite material is cutout altogether (see view 411). One or more recesses or cutouts may be formed by arranging ferrite material of varying thickness and shape.

Figure 5A:
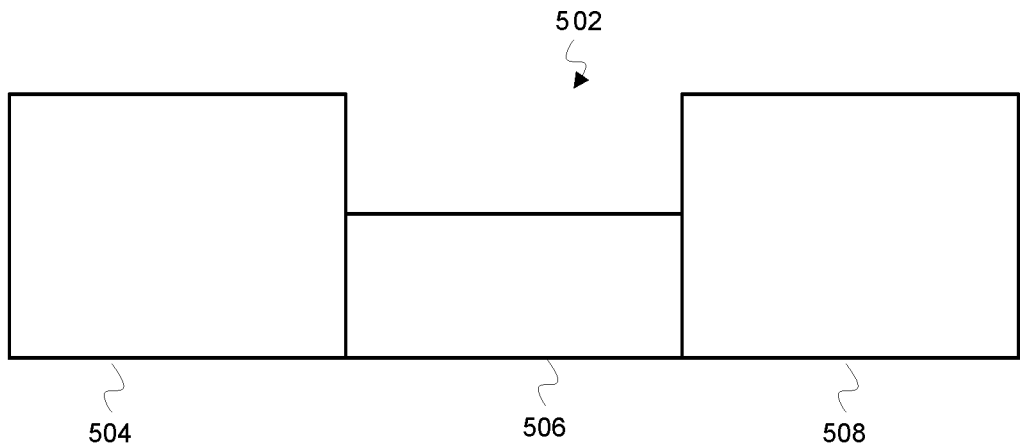
FIG. 5A is a block diagram illustrating ferrite material pieces arranged to create a void configured to accommodate portions of one or more secondary coils according to some implementations.

FIG. 5A is a block diagram illustrating ferrite material pieces arranged to create a void configured to accommodate portions of one or more secondary coils according to some implementations. As shown in FIG. 5A, three pieces of ferrite material may be placed in juxtaposition. That is, ferrite material piece 504 may be placed next to ferrite material piece 506 which is next to ferrite material piece 508. As arranged, the ferrite material pieces create a void 502. In FIG. 5A, the void 502 forms a recess in the ferrite material pieces. In some implementations, at least a portion of a secondary coil is placed in the void 502. For example, overlapping portions of a main secondary coil and an auxiliary secondary coil may reside in the void 502. In this example, all portions of secondary coils reside atop the ferrite material pieces 504, 506, 508, and will therefore reside atop an underlying ferrite material. Implementations may form voids by arranging (such as by stacking and juxtaposing) ferrite material pieces in any suitable configuration. The ferrite material pieces can be of any suitable thickness and shape.

Figure 5B:
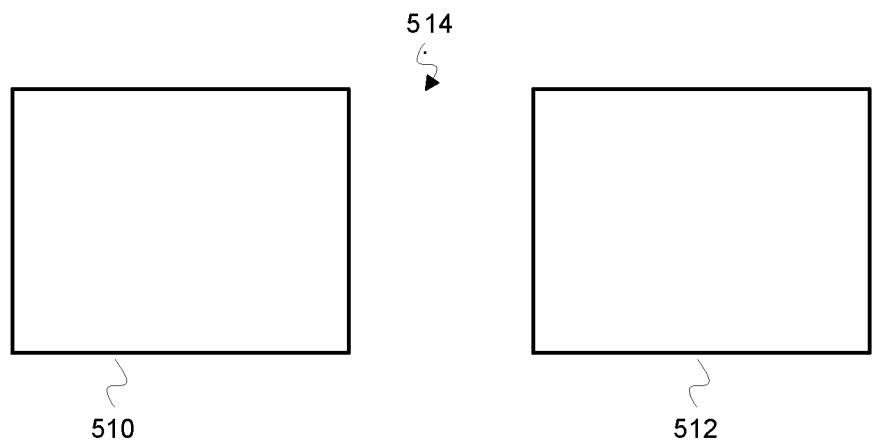
FIG. 5B is a block diagram illustrating ferrite material pieces arranged to create a void configured to accommodate portions of one or more secondary coils according to some implementations.

FIG. 5B is a block diagram illustrating ferrite material pieces arranged to create a void configured to accommodate portions of one or more secondary coils according to some implementations. As shown in FIG. 5B, a ferrite material piece 510 may be in proximity to, but not in contact with, a ferrite material piece 512. In this arrangement, the ferrite material pieces 510, 512 may create a void 514. As shown in FIG. 5B, the void 514 may form a cutout configured to accommodate one or more portions of one or more secondary coils. For example, overlapping portions of a main secondary coil and an auxiliary secondary coil may reside in the void 514. In this example, overlapping portions of secondary coils reside between ferrite material pieces 510, 512 and will not reside on any underlying ferrite material.

Figure 6A:
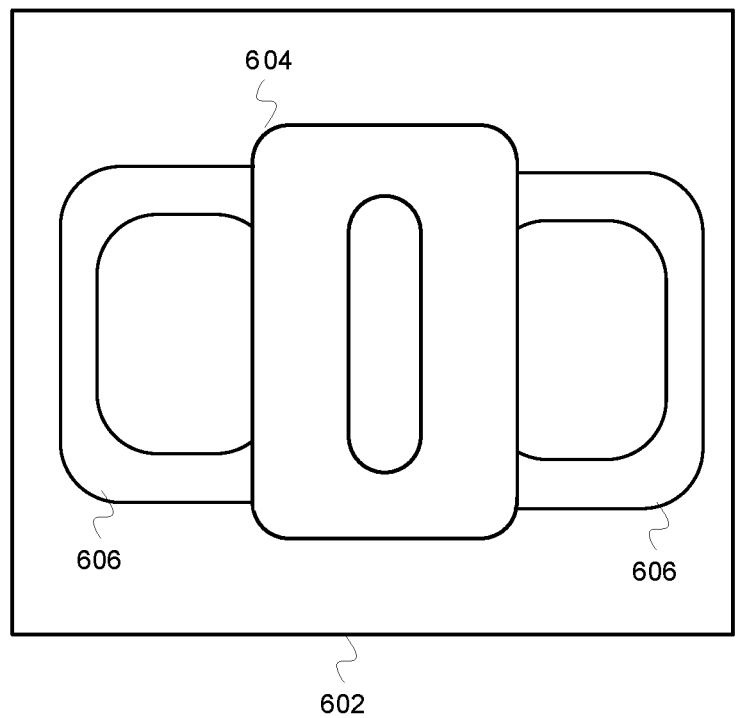
FIG. 6A illustrates a top view of components of a wireless power receiver apparatus according to some implementations.
Figure 6B:
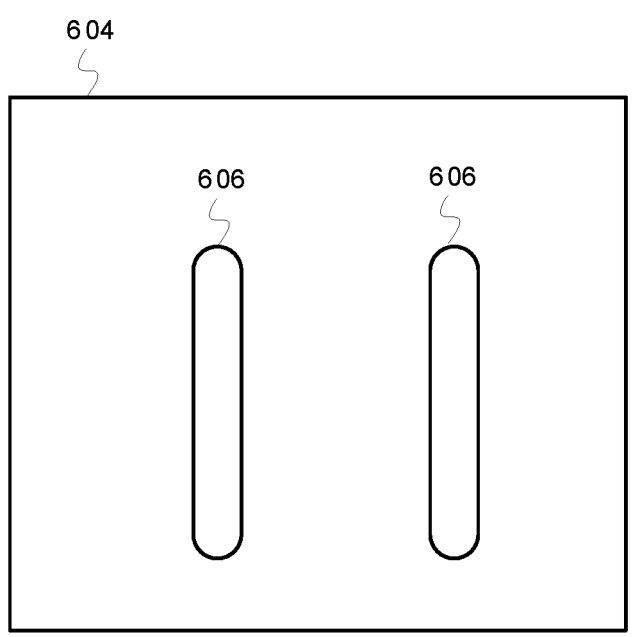
FIG. 6B illustrates a bottom view of components of a wireless power receiver apparatus according to some implementations.

One or more recesses or cutouts may be formed by milling or otherwise removing ferrite material. The ferrite material may be one unitary piece or a composite of multiple ferrite material pieces. FIGS. 6A-B show additional implementations where the voids are cutouts of the ferrite material.

FIG. 6A illustrates a top view of components of a wireless power receiver apparatus according to some implementations. As shown in FIG. 6A, the wireless power receiver apparatus may include a ferrite material 602, main secondary coil 604, and auxiliary secondary coils 606. The main secondary coil 604 and auxiliary secondary coils 606 may include a Litz wire or other suitable conductive material(s) wound in any suitable geometric forms, such as square-shaped forms shown in FIG. 6A. The Litz wire or other suitable conductive material(s) may be wound in any suitable direction to form the secondary coils 604 and 606. In some implementations, the wire is wound clockwise or counterclockwise to form the square-shape in FIG. 6A. As described above, one or more portions of one or more secondary coils may be recessed in the ferrite material 602. FIG. 6B shows how portions of the auxiliary secondary coils 606 may be recessed into the ferrite material 602.

FIG. 6B illustrates a bottom view of components of a wireless power receiver apparatus according to some implementations. As shown in FIG. 6B, the wireless power receiver apparatus may include a ferrite material 602, and auxiliary secondary coils 606. As shown, portions of the ferrite material 602 may be cut away to accommodate portions of the auxiliary secondary coils 606. Although not shown in FIG. 6B, portions of the auxiliary secondary coil that are recessed in the ferrite material 602 are overlaid by portions of the main secondary coil 604.

In some implementations, any suitable portion of a secondary coil may be recessed into one or more voids in the ferrite material. In some instances, the ferrite material is a unitary piece of ferrite material, where portions have recesses to accommodate secondary coils. In some instances, the ferrite material may be absent such that the ferrite material is not contiguous (see FIG. 6B).

Figure 7A:
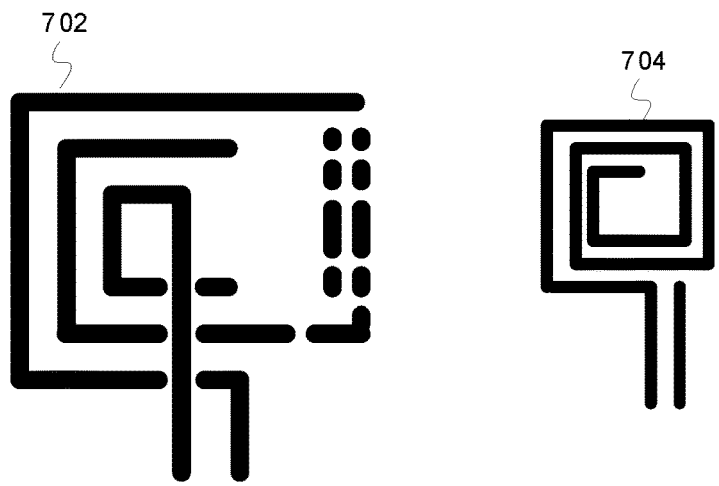
FIG. 7A is a block diagram illustrating coils for use in a wireless power receiver apparatus including a printed circuit board (PCB) according to some implementations.

FIG. 7A is a block diagram illustrating coils configured for use in a wireless power receiver apparatus including a PCB according to some implementations. FIG. 7A shows a bottom-layer main secondary coil 702 and a bottom-layer auxiliary secondary coil 704. Although shown separately in FIG. 7A, the bottom-layer main secondary coil 702 and bottom-layer auxiliary secondary coil 704 may be configured for cooperative placement on a PCB (see FIG. 7B).

Figure 7B:
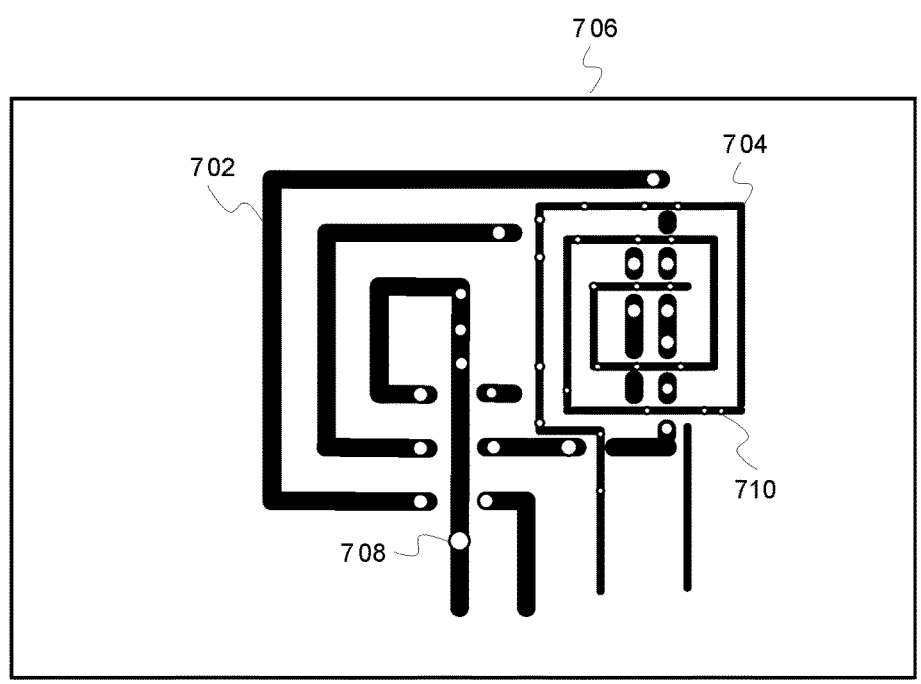
FIG. 7B is a block diagram illustrating a bottom view of a PCB including coils configured for use in a wireless power receiver apparatus according to some implementations.

FIG. 7B is a block diagram illustrating a bottom view of a PCB including coils configured for use in a wireless power receiver apparatus according to some implementations. As shown in FIG. 7B, a PCB 706 may include the bottom-layer main secondary coil 702 and the bottom-layer auxiliary secondary coil 704. The main and auxiliary secondary coils may reside on a bottom layer of the PCB 706. The bottom-layer main secondary coil 702 may not be a continuous path of conductive material. Rather, the bottom-layer main secondary coil 702 may include concentric conductive paths and non-continuous conductive paths (see FIG. 7A for an isolated view of conductive paths included in the main secondary coil 702). The bottom-layer auxiliary secondary coil 704 may be interspersed among paths of the bottom-layer main secondary coil 702. The bottom-layer auxiliary secondary coil 704 may include a continuous, concentric path of conductive material and a straight path of conductive material representing the end connection of the coil (see FIG. 7A for an isolated view of the paths). In some implementations, the PCB may include multiple bottom-layer auxiliary secondary coils.

Figure 8A:
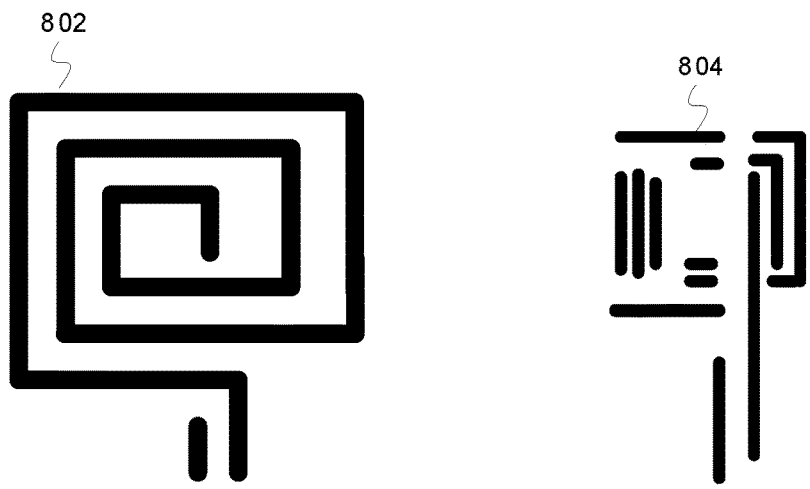
FIG. 8A is a block diagram illustrating coils configured for use in a wireless power receiver apparatus including a PCB according to some implementations.
Figure 8B:
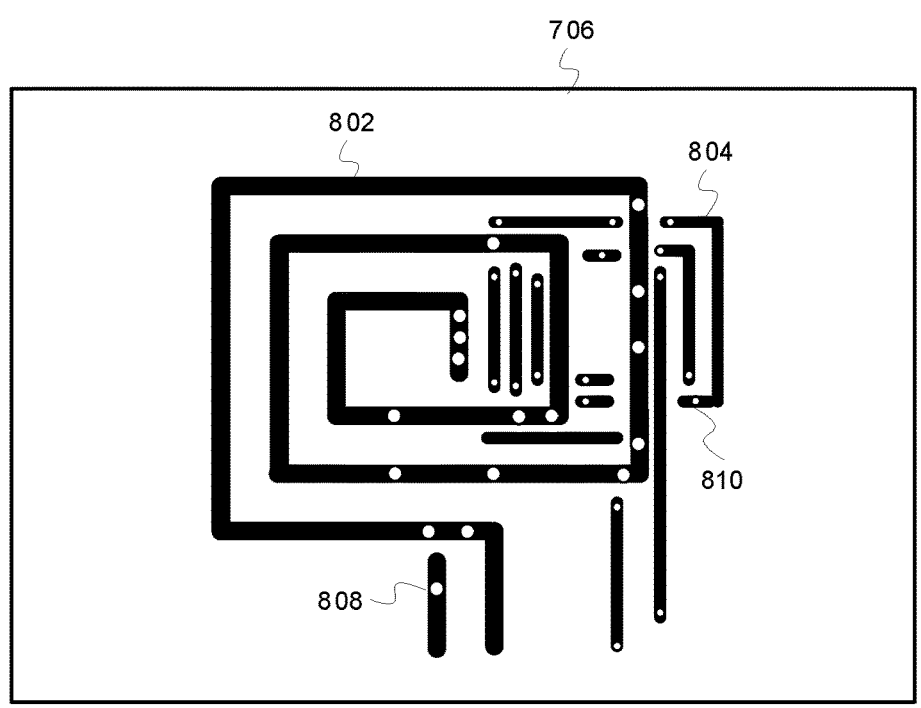
FIG. 8B is a block diagram illustrating a top view of a PCB including coils configured for use in a wireless power receiver apparatus according to some implementations.

The PCB 706 may include multiple main vias 708 that travel through PCB layers to connect the bottom-layer main secondary coil 702 to a top-layer main secondary coil (not shown in FIG. 7B; see FIGS. 8A-B). The bottom-layer auxiliary secondary coil 704 may include auxiliary vias 710 that travel through PCB layers to connect the bottom-layer auxiliary secondary coil 704 to a top-layer auxiliary secondary coil (not shown in FIG. 7B; see FIGS. 8A-B). The main and auxiliary vias may interconnect the top and bottom layers of the coils and in turn, may increase the effective thickness of the coils. This may reduce the electrical resistance, thereby reducing power loss.

FIG. 8A is a block diagram illustrating coils configured for use in a wireless power receiver apparatus including a PCB according to some implementations. FIG. 8A shows a top-layer main secondary coil 802 and a top-layer auxiliary secondary coil 804. Although shown separately in FIG. 8A, the top-layer main secondary coil 802 and top-layer auxiliary secondary coil 804 may be configured for cooperative placement on a PCB (see FIG. 8B).

FIG. 8B is a block diagram illustrating a top view of a PCB including coils configured for use in a wireless power receiver apparatus according to some implementations. In FIG. 8B, a PCB 806 includes the top-layer main secondary coil 802 and the top-layer auxiliary secondary coil 804. The main and auxiliary secondary coils may reside in a top layer of the PCB 806. The top-layer main secondary coil 802 may include a continuous path of conductive material and a small path of conductive material representing the end connection. The top-layer auxiliary secondary coil 804 may reside among the continuous path of the top-layer main secondary coil 802. The top-layer auxiliary secondary coil 804 includes non-continuous paths of conductive material (see FIG. 7A for an isolated view of the paths). The main vias 808 may travel through PCB layers to connect the top-layer main secondary coil 802 to the bottom-layer main secondary coil 702. Auxiliary vias 810 that travel through PCB layers may connect the top-layer auxiliary secondary coil 804 to the bottom-layer auxiliary secondary coil 704. The main and auxiliary vias may connect the top and bottom layers of the main coil and those of the auxiliary coil in turn increase thickness of the main and the auxiliary coils. As a result, the electrical resistance of these coils is reduced and in turn the conduction power loss is reduced. In some implementations, the PCB can include more than one top-layer auxiliary secondary coils. Also, in other implementations, the main coil and the auxiliary coils can be disposed in multiple layers of the PCB such that they do not get shorted. In addition, using multiple vias connecting the multiple layers either completely or partially (hidden vias), the overall thickness of the main coils and the auxiliary coils may be increased to reduce the overall losses.

Some implementations may not include both top-layer and bottom-layer coils. Some implementations may include main and secondary coils residing in a plurality of layers. Referring to FIG. 7B, in some implementations, segments of the main secondary coil 702 can reside in a plurality of layers of the PCB 706. For example, the via 708 may be connected to a plurality of segments of the main secondary coil 702, where each segment resides in a different layer of the PCB 706. In some instances, the segments are superimposed in different layers of the PCB. The auxiliary secondary coil 704 may be similarly segmented and disposed in a plurality of layers. In some implementations, the plurality of layers includes at least one of the top and bottom sides of the PCB. In some implementations, segments of the main secondary coil do not intersect with segments of the auxiliary secondary coil.

FIGS. 1-8B and the operations described herein are examples meant to aid in understanding example implementations and should not be used to limit the potential implementations or limit the scope of the claims. Some implementations may perform additional operations, fewer operations, operations in parallel or in a different order, and some operations differently.

As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a and b and c.

Various modifications to the implementations described in this disclosure may be readily apparent to persons having ordinary skill in the art, and the generic principles defined herein may be applied to other implementations without departing from the scope of this disclosure. Thus, the claims are not intended to be limited to the implementations shown herein but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

What is claimed is:

1. A wireless power reception apparatus comprising:
 a ferrite layer including a void;
 a first secondary coil to generate first power in cooperation with one or more primary coils of a wireless power transmission apparatus, wherein at least a portion of the first secondary coil resides in the void of the ferrite layer, wherein the void of the ferrite layer extends through an entire thickness of the ferrite layer; and
 one or more second secondary coils to generate second power in cooperation with the one or more primary coils of the wireless power transmission apparatus, wherein a portion of the second secondary coil overlaps the portion of the first secondary coil residing in the void of the ferrite layer.

2. The wireless power reception apparatus of claim 1, wherein the void is formed by stacking pieces of ferrite material.

3. The wireless power reception apparatus of claim 1, wherein each of the first secondary coil and the one or more secondary coils includes a square-shaped or a rectangular-shaped path of copper wire.

4. The wireless power reception apparatus of claim 1, wherein the wireless power reception apparatus is coupled with an electronic device, and wherein the first power and the second power charge a battery of the electronic device.

5. The wireless power reception apparatus of claim 1, wherein the first secondary coil is a main secondary coil and wherein the second secondary coils are an auxiliary secondary coil.

6. The wireless power reception apparatus of claim 1, wherein the first secondary coil is an auxiliary secondary coil and wherein the second secondary coils are main secondary coils.

7. A method for creating a wireless power receiver apparatus comprising:
creating a void in a ferrite material, wherein the void extends through an entire thickness of the ferrite material;
depositing a first secondary coil on the ferrite material, wherein the first secondary coil is designed to generate first power in cooperation with one or more primary coils of a wireless power transmission apparatus, wherein at least a portion of the first secondary coil resides in the void of the ferrite material; and
depositing a second secondary coil on the ferrite material, wherein the second secondary coil is designed to generate second power in cooperation with the one or more primary coils of the wireless power transmission apparatus, wherein a portion of the second secondary coil overlays the portion of the first secondary coil residing in the void of the ferrite material.

8. The method of claim 7, wherein creating the void in the ferrite material comprises stacking pieces of the ferrite material in a structure that omits the void.

9. The method of claim 8, wherein the pieces of the ferrite material are of uniform thickness.

10. The method of claim 8, wherein two or more of the pieces of the ferrite material are differently shaped.

11. The method of claim 7, wherein depositing the first secondary coil includes constructing the first secondary coil from a square-shaped or a rectangular-shaped path of copper wire.

* * * * *